United States Patent [19]

Tomisawa et al.

[11] 4,187,514
[45] Feb. 5, 1980

[54] JUNCTION TYPE FIELD EFFECT TRANSISTOR

[75] Inventors: Yutaka Tomisawa, Yokohama; Tatsuro Mitani, Kawasaki, both of Japan

[73] Assignee: Tokyo Shibaura Electric Co., Ltd., Kawasaki, Japan

[21] Appl. No.: 848,569

[22] Filed: Nov. 4, 1977

[30] Foreign Application Priority Data

Nov. 9, 1976 [JP] Japan ............................... 51-133724

[51] Int. Cl.$^2$ ............................................ H01L 29/80
[52] U.S. Cl. ....................................... 357/22; 357/55; 357/59; 357/68; 357/71
[58] Field of Search ....................... 357/22, 23, 59, 55, 357/68, 71

[56] References Cited

U.S. PATENT DOCUMENTS

| 3,977,017 | 8/1976 | Ishitani | 357/22 |
| 3,978,515 | 8/1976 | Evans et al. | 357/59 |

Primary Examiner—Edward J. Wojciechowicz
Attorney, Agent, or Firm—Finnegan, Henderson, Farabow & Garrett

[57] ABSTRACT

A junction type field effect transistor comprising a semiconductor substrate; semiconductor regions formed in the semiconductor substrate and exposed on a major surface thereof, the semiconductor regions including a gate region and an isolation region; and a polycrystalline semiconductor layer formed on the surface of the gate region or on the surfaces of the gate region and the isolation region. The polycrystalline semiconductor layer contains an impurity of the same conductivity type as the gate and the isolation regions.

14 Claims, 12 Drawing Figures

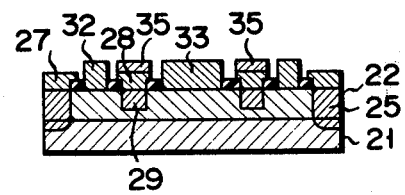
FIG. 4
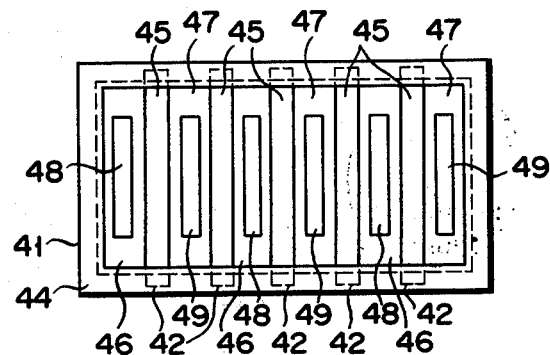
FIG. 5
FIG. 6
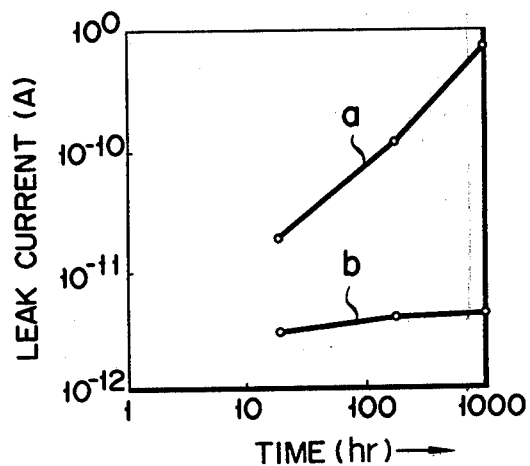

JUNCTION TYPE FIELD EFFECT TRANSISTOR

BACKGROUND OF THE INVENTION

I. Field of the Invention

This invention relates to junction type field effect transistors.

II. Description of the Prior Art

Junction type field effect transistors (hereinafter referred to as J-FETs) are also called unipolar transistors and have various features which distinguish them from common bipolar transistors. The greatest of these features is high input impedance, which makes them very suitable for use as an impedance conversion circuit device. On the other hand, when used as an amplifier device, J-FETs have the disadvantage of being low in gain. The gain of a J-FET is expressed in terms of the mutual conductance thereof, which is proportional to the ratio of gate width, W, to gate length, L. Accordingly, a J-FET having a high gain will be obtained if the ratio W/L is increased. In order to increase the ratio W/L, L must be decreased and W must be increased. However, L has a lower limit by reason of the problem of processing accuracy as well as the fact that excessively small values for L cause the inherent pentode characteristics of the J-FET to approximate triode characteristics, so that a gate region having all the greater value for W is required. The formation of such an elongated gate region is difficult in the prior art, thus resulting in a lower yield of the products and a greater cost of production.

FIG. 1 schematically illustrates a sectional view of a prior art N-channel J-FET chip. In this figure, reference numeral 1 designates a P-type semiconductor body used as a gate region, on which an N-type epitaxial layer 2 is formed. In epitaxial layer 2 are formed an upper gate region 3, a drain region 4, and a source region 5 as well as an isolation region 6 for isolating these operational regions into an island-like form and connecting upper gate region 3 to lower gate region 1. A channel 7 is to be formed between upper gate region 3 and lower gate region 1. On epitaxial layer 2, a source electrode 8, a drain electrode 9, and an oxide film 10 serving for surface passivation are formed.

In the above-described structure, the peripheral length of the P-N junction of upper gate region 3 is so great that minor defects become very likely to be created with the result that such defects may impair the P-N junction. Moreover, if ionic contaminants are introduced into oxide film 10 formed on upper gate region 3 and isolation region 6, the surfaces of these regions may create a faulty channel and thereby develop an electrical short circuit. Furthermore, if mobile ions such as sodium ions are present in oxide film 10, the leak current at the boundaries between the aforesaid regions 3, 6 and the corresponding oxide layer 10 will increase with time and result in unsatisfactory reliability.

SUMMARY OF THE INVENTION

It is an object of this invention to provide a J-FET which can overcome the shortcomings of the above-described prior art J-FET.

In accordance with this invention, there is provided a junction type field effect transistor comprising a semiconductor substrate including a semiconductor layer of one conductivity type having an exposed major surface; desired semiconductor regions formed in said semiconductor layer and exposed on said major surface thereof, said semiconductor regions including a gate region and an isolation region both of opposite conductivity type; and a polycrystalline semiconductor layer formed on the exposed surface of said gate region or on the respective exposed surfaces of said gate region and said isolation region, said polycrystalline semiconductor layer containing an impurity of said opposite conductivity type.

BRIEF DESCRIPTION OF THE DRAWINGS

FIG. 4 is a sectional view of another J-FET embodying this invention;

FIG. 5 is a plan view of a further J-FET embodying this invention; and

FIG. 6 is a graph showing the characteristics of a J-FET in accordance with this invention as well as those of a prior art J-FET.

DETAILED DESCRIPTION OF THE PREFERRED EMBODIMENTS

Figure 2:
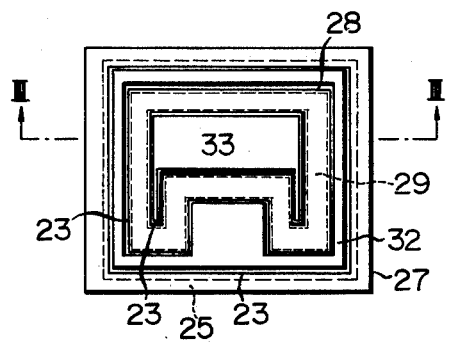
FIG. 2 is a plan view of a J-FET embodying this invention.

This invention is based on the discovery that a J-FET which is free from the above-described shortcomings of the prior art can be obtained by providing a semiconductor substrate having portions where a gate region and/or an isolation region are to be formed, depositing on these portions a polycrystalline semiconductor layer containing a diffusion impurity, and then diffusing the impurity into the semiconductor substrate to form the aforesaid regions and also by leaving the polycrystalline semiconductor layer as it is so as to serve as a protective film.

In a preferred aspect, this invention is generally applied to N-channel J-FETs, though it is also applicable to P-channel J-FETs. Some of the preferred embodiments will be described below with reference to the accompanying drawings. Like elements are given like reference characters throughout the figures.

First of all, the fabrication of an N-channel J-FET for low-frequency applications, which is an embodiment of this invention as generally illustrated in the plan view of FIG. 2, is explained by referring to FIGS. 3A to 3G.

Figure 3A:
FIGS. 3A to 3G are sectional views showing a sequence of steps in manufacturing the J-FET in accordance with this invention, FIG. 3G approximately corresponding to a sectional view taken along the line III—III in FIG. 2.
Figure 3B:
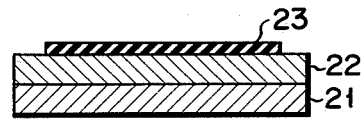

As illustrated in FIG. 3A, an N-type silicon epitaxial layer 22 having a resistivity of, for example, 1 Ω-cm is formed on a P-type silicon semiconductor body 21 (which will later serve as a gate region) to provide a semiconductor substrate 20. This semiconductor substrate 20 is heated in an oxidizing atmosphere to deposit an oxide layer 23 on a major surface thereof, or the exposed surface of epitaxial layer 22 in this case. Then, a desired part of oxide layer 23 is removed by means of the photoetching technique to make an opening 24 (FIG. 3B).

Figure 3C:
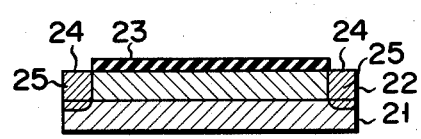
Figure 3D:
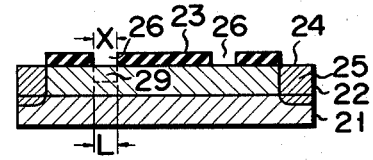
Figure 3E:
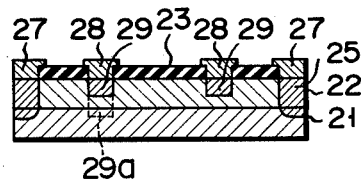

Then, as illustrated in FIG. 3C, an isolation region 25 is formed by doping epitaxial layer 22, through opening 24, with a P-type impurity (such as boron) at a surface concentration of, for example, $1 \times 10^{20}$ to $1 \times 10^{21}$ atoms/cm$^3$ until isolation region 25 reaches semiconductor body 21. The doping of boron may be carried out, for example, by depositing in opening 24 a silicon dioxide film containing boron and then heating the assembly to diffuse the boron into epitaxial layer 22. Thereafter, as illustrated in FIG. 3D, an opening 26 for forming an upper gate region is made in oxide layer 23 by means of the photoetching technique. The width, X, of opening 26 should be chosen so that the length, L, of the subsequently formed upper gate region 29 will be sufficient to retain the pentode characteristics of the J-FET. The required length, L, of upper gate region 29 depends on the impurity concentration or resistivity in the channel portion, and is of the order of $3\mu$ in this case (where the resistivity of N-type epitaxial layer 22 is 1 $\Omega$-cm).

Then, an upper gate region 29 is formed by depositing in openings 24 and 26 polycrystalline silicon layers 27 and 28 containing a P-type impurity (such as boron) at a concentration of $10^{20}$ to $10^{21}$ atoms/cm$^3$ and then heating the assembly for a predetermined time to diffuse the boron into epitaxial layer 22. Preferably, a part 29a of upper gate region 29 is formed in such a manner that it reaches lower gate region 21 and thereby establishes a connection between upper and lower gate regions 29 and 21. During this step, the boron in polycrystalline silicon layer 27 diffuses into isolation region 25. Thus, the boron in isolation region 25 is prevented from being scattered as a result of the thermal diffusion treatment for forming upper gate region 29 and also from being subjected to reverse diffusion into polycrystalline silicon layer 27. In addition, good electrical contact is established between polycrystalline layer 27 and isolation region 25. It should be understood that the impurity (particularly, boron) in polycrystalline layers 27 and 28 is liable to be scattered in the open air during the above-described thermal diffusion treatment. In order to avoid this, the thermal diffusion treatment is desirably carried out after an oxide layer (not shown) of silicon dioxide or the like has been formed on polycrystalline layers 27 and 28.

Figure 3F:
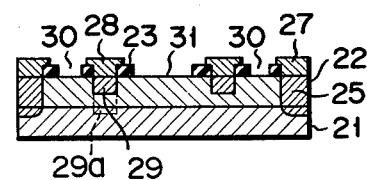
Figure 3G:
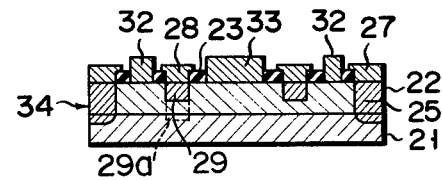

Then, an opening 30 for forming a source electrode and an opening 31 for forming a drain electrode are made in oxide layer 23 by means of the photoetching technique (FIG. 3F). Finally, a desired J-FET 34 is obtained by depositing a metal layer (such as aluminum layer) in openings 30 and 31 to form a source electrode 32 and a drain electrode 33 (FIG. 3G). In order to establish good ohmic contact, these electrodes 32 and 33 may be formed after epitaxial layer 22 is lightly doped with an N-type impurity (such as phosphorus) through openings 30 and 31. Since the characteristics of a J-FET for low-frequency applications are not affected by the resistance of its upper gate region, it is not always necessary to form an additional metallic electrode of aluminum or the like on polycrystalline silicon layer 28.

In the J-FET of this invention having the above-described construction, the polycrystalline silicon layer used for forming the P-N junction is left as it is, so that the P-N junction is protected and the chance of introduction of defects is decreased. If the polycrystalline silicon layer was removed, openings 24 and 26 would be enlarged, the P-N junction might be exposed, and defects would be introduced with greater ease. In addition, the inversion of the upper portion of the upper gate region due to the presence of alkali metals such as sodium and the like can be suppressed by the gettering action of polycrystalline silicon and the inclusion therein of an impurity of the same conductivity type as the gate region, and the creation of a faulty channel and the accompanying change with time of the leak current can be eliminated almost completely. Thus, the J-FET of this invention exhibits improved reliability and achieves a high gain because the ratio W/L of the gate region can be increased without any inconvenience.

Figure 1:
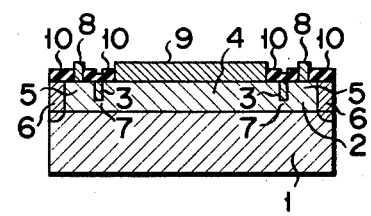
FIG. 1 is a sectional view of a prior art J-FET.

In order to compare the characteristics of the J-FET of this invention having the above-described construction with those of a prior art J-FET as illustrated in FIG. 1, a bias voltage of 40 V was applied and the change with time of the leak current between gate and source was measured at a temperature of 150° C. The results are shown in FIG. 6 where Curve a is for the prior art J-FET and Curve b is for the J-FET of this invention. As can be seen from this figure, the J-FET of this invention made little change with time of the leak current between gate and source, exhibiting stabilized characteristics and hence very excellent reliability.

FIG. 4 illustrates a J-FET for high-frequency applications which is very similar to that of FIG. 3G except for a metallic electrode 35 formed on polycrystalline silicon layer 28. In a J-FET for high-frequency applications, some characteristics such as switching speed and the like are degraded if the resistance of upper gate region 29 is high. Accordingly, a metallic electrode 35 of aluminum or the like having low electrical resistance is formed in order to decrease the resistance of the gate electrode. In this case, a connection between upper gate region 29 and lower gate region 21 is established by connecting a part of metallic electrode 35 to polycrystalline silicon layer 27 overlying isolation region 25. Since aluminum penetrates into polycrystalline silicon layer 28, metallic electrode 35 is advantageously composed of a high-melting metal such as titanium or a laminate of titanium and aluminum.

FIG. 5 is a plan view of a further J-FET for low-frequency applications embodying this invention. In this figure, reference numeral 41 designates a P-type isolation region similar to the aforesaid isolation region 25, which surrounds the operational regions into an island-like form. A plurality of P-type gate regions 42 in the form of strips are arranged in parallel with one another and spaced from one another and from isolation region 41. Both longitudinal ends of each gate region 42 reach isolation region 41. Polycrystalline silicon layers 44 and 45 containing an impurity of the same conductivity type as gate regions 42 and isolation region 41 are formed respectively on the surfaces of gate regions 42 and on the surface of isolation region 41. In addition, aluminum electrodes 48 and 49 are formed respectively on source regions 46 and drain regions 47, which regions 46 and 47 are provided between isolation region 41 and gate regions 42 and between adjacent gate regions 42.

What we claim is:

1. A junction type field effect transistor comprising:
a semiconductor substrate including a semiconductor layer of one conductivity type having an exposed major surface, said substrate formed on a semiconductor body of opposite conductivity type constituting a lower gate region;
semiconductor regions formed in said semiconductor layer and exposed on said major surface thereof including an exposed source region of said one conductivity type, an exposed gate region of said opposite conductivity type, an exposed drain region of said one conductivity type, an exposed isolation region of said opposite conductivity type constituting a closed path to surround said source, gate, and drain regions; said gate region having a sufficient length for said field effect transistor to attain pentode characteristics; and a polycrystalline semiconductor layer formed on the exposed surface of said gate region between said exposed drain and isolation regions, said polycrystalline semiconductor layer containing an impurity of said opposite conductivity type.

2. A field effect transistor as claimed in claim 1 wherein said polycrystalline semiconductor layer is composed of polycrystalline silicon.

3. A field effect transistor as claimed in claim 2 wherein said impurity is a P-type one.

4. A field effect transistor as claimed in claim 3 wherein said impurity is present in said polycrystalline semiconductor layer at a concentration of $10^{20}$ to $10^{21}$ atoms/cm$^3$.

5. A field effect transistor as claimed in claim 1 wherein said gate region constitutes a closed path.

6. A field effect transistor as claimed in claim 5 wherein said polycrystalline semiconductor layer is composed of polycrystalline silicon containing a P-type impurity.

7. A field effect transistor as claimed in claim 1 wherein a plurality of gate regions are present, said gate regions being arranged in parallel with one another and spaced from one another and from said isolation region.

8. A field effect transistor as claimed in claim 7 wherein said polycrystalline semiconductor layer is composed of polycrystalline silicon containing a P-type impurity.

9. A field effect transistor as claimed in claim 1 wherein a part of said gate region formed in said semiconductor layer reaches said semiconductor body.

10. A field effect transistor as claimed in claim 1 wherein said polycrystalline semiconductor layer overlying said gate region has a metallic layer formed thereon, said metallic layer constituting an electrode a part of which is connected to said polycrystalline semiconductor layer overlying said isolation region, and said isolation region reaches said semiconductor body.

11. A field effect transistor as claimed in claim 1 wherein said polycrystalline semiconductor layer is also formed on said exposed surface of said isolation region.

12. A method of manufacturing a junction type field effect transistor which comprises: forming a semiconductor substrate including a semiconductor layer of one conductivity type having an exposed major surface on a semiconductor body of opposite conductivity type; forming an insulating layer on said major surface; removing a part of said insulating layer to make a first opening forming a closed path; doping said semiconductor layer with an impurity of opposite conductivity type through said first opening to form an isolation region extending into said semiconductor body through said semiconductor layer; removing a part of the remainder of said insulating layer to make a second opening within a region surrounded by said first opening; forming in said second opening a polycrystalline semiconductor layer containing an impurity of said opposite conductivity type; and diffusing said impurity from said polycrystalline semiconductor layer into said semiconductor layer to form a gate region with sufficient length to attain pentode characteristics of said field effect transistor.

13. A method as claimed in claim 12, comprising forming a polycrystalline semiconductor layer containing an impurity of said opposite conductivity in said first opening prior to said diffusing step.

14. A method as claimed in claim 12, wherein said polycrystalline semiconductor layers are formed of polycrystalline silicon.

* * * * *